US 12,002,758 B2

(12) United States Patent
Xie et al.

(10) Patent No.: US 12,002,758 B2
(45) Date of Patent: Jun. 4, 2024

(54) BACKSIDE METAL-INSULATOR-METAL (MIM) CAPACITORS EXTENDING THROUGH BACKSIDE INTERLAYER DIELECTRIC (BILD) LAYER OR SEMICONDUCTOR LAYER AND PARTLY THROUGH DIELECTRIC LAYER

(71) Applicant: International Business Machines Corporation, Armonk, NY (US)

(72) Inventors: Ruilong Xie, Niskayuna, NY (US); Takeshi Nogami, Schenectady, NY (US); Roy R. Yu, Poughkeepsie, NY (US); Balasubramanian Pranatharthiharan, Santa Clara, CA (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 17/453,516

(22) Filed: Nov. 4, 2021

(65) Prior Publication Data

US 2023/0133157 A1 May 4, 2023

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76802* (2013.01); *H01L 21/76877* (2013.01);
(Continued)

(58) Field of Classification Search
CPC ............. H01L 23/5286; H01L 23/5223; H01L 23/5226; H01L 28/60
See application file for complete search history.

(56) References Cited

U.S. PATENT DOCUMENTS 4,816,884 A 3/1989 Hwang et al.
4,905,065 A 2/1990 Selcuk et al.
(Continued)

OTHER PUBLICATIONS

Imec demonstrates critical building blocks for a backside power delivery network (Jun. 14, 2021)retrieved Jun. 15, 2021 from https://sciencex.com/wire-news/385105907/imec-demonstrates-critical-building-blocks-for-a-backside-power.html.
(Continued)

*Primary Examiner* — Lex H Malsawma
*Assistant Examiner* — Bruce R. Smith
(74) *Attorney, Agent, or Firm* — Patterson + Sheridan, LLP

(57) ABSTRACT

A method of fabricating a semiconductor device comprises forming backside power rails in a dielectric layer arranged above a backside interlayer dielectric (BILD) layer or a semiconductor layer, forming a trench that extends through the BILD layer or the semiconductor layer and partly through the dielectric layer between the backside power rails, depositing a plurality of layers to form a backside
(Continued)

metal-insulator-metal (MIM) capacitor in the trench, and forming a first contact to a first metal layer of the plurality of layers. Forming the first contact comprises forming first recesses in a second metal layer of the plurality of layers, and filling the first recesses with an insulative material. The method further comprises forming a second contact to the second metal layer. Forming the second contact comprises forming second recesses in the first metal layer, and filling the second recesses with the insulative material.

20 Claims, 15 Drawing Sheets

(51) Int. Cl.
*H01L 23/50* (2006.01)
*H01L 23/522* (2006.01)
*H01L 49/02* (2006.01)

(52) U.S. Cl.
CPC .......... *H01L 23/50* (2013.01); *H01L 23/5223* (2013.01); *H01L 23/5226* (2013.01); *H01L 28/60* (2013.01)

(56) References Cited

U.S. PATENT DOCUMENTS

| | | | |
|---|---|---|---|
| 8,101,494 B2 | 1/2012 | Collins et al. | |
| 8,729,665 B2 | 5/2014 | Klootwijk et al. | |
| 8,759,947 B2 | 6/2014 | Tan et al. | |
| 9,978,708 B2 | 5/2018 | Chen et al. | |
| 2013/0181326 A1* | 7/2013 | Cheng | H01L 28/86 |
| | | | 438/387 |
| 2017/0012029 A1 | 1/2017 | Lambert et al. | |
| 2017/0186643 A1* | 6/2017 | Stamper | H01L 21/6835 |
| 2020/0411636 A1* | 12/2020 | Kao | H01L 28/91 |

OTHER PUBLICATIONS

Prasad, D., Nibhanupudi, S. T., Das, S., Zografos, O., Chehab, B., Sarkar, S., . . . & Sinha, S. (Dec. 2019). Buried power rails and back-side power grids: Arm® CPU power delivery network design beyond 5nm. In 2019 IEEE International Electron Devices Meeting (IEDM) (pp. 19-1). IEEE.

C. .-Y. Lin et al., "Reliability Characteristics of a High Density Metal-Insulator-Metal Capacitor on Intel's 10+ Process," 2020 IEEE International Reliability Physics Symposium (IRPS), 2020, pp. 1-4, doi: 10.1109/IRPS45951.2020.9128312. Abstract Only.

* cited by examiner

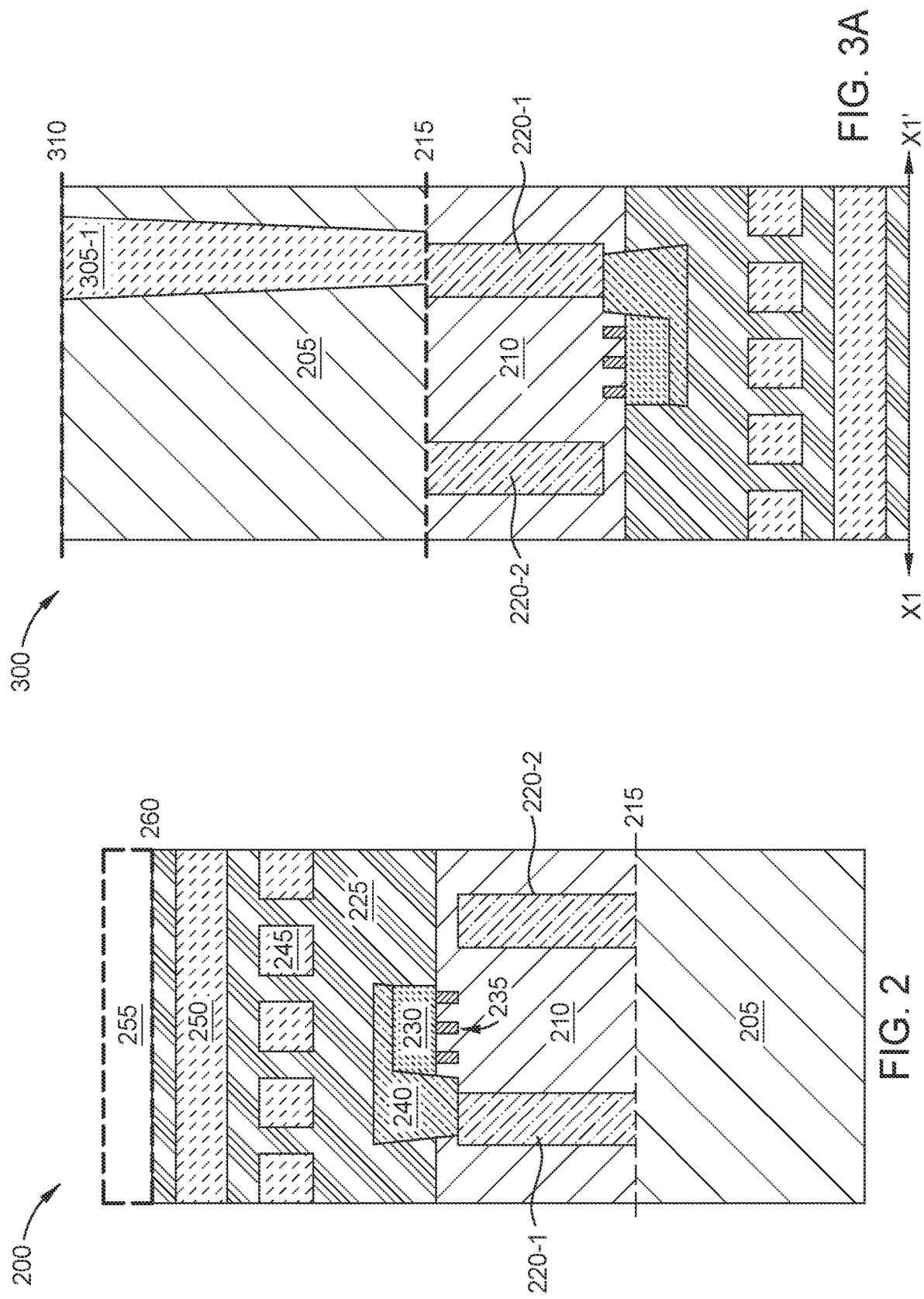

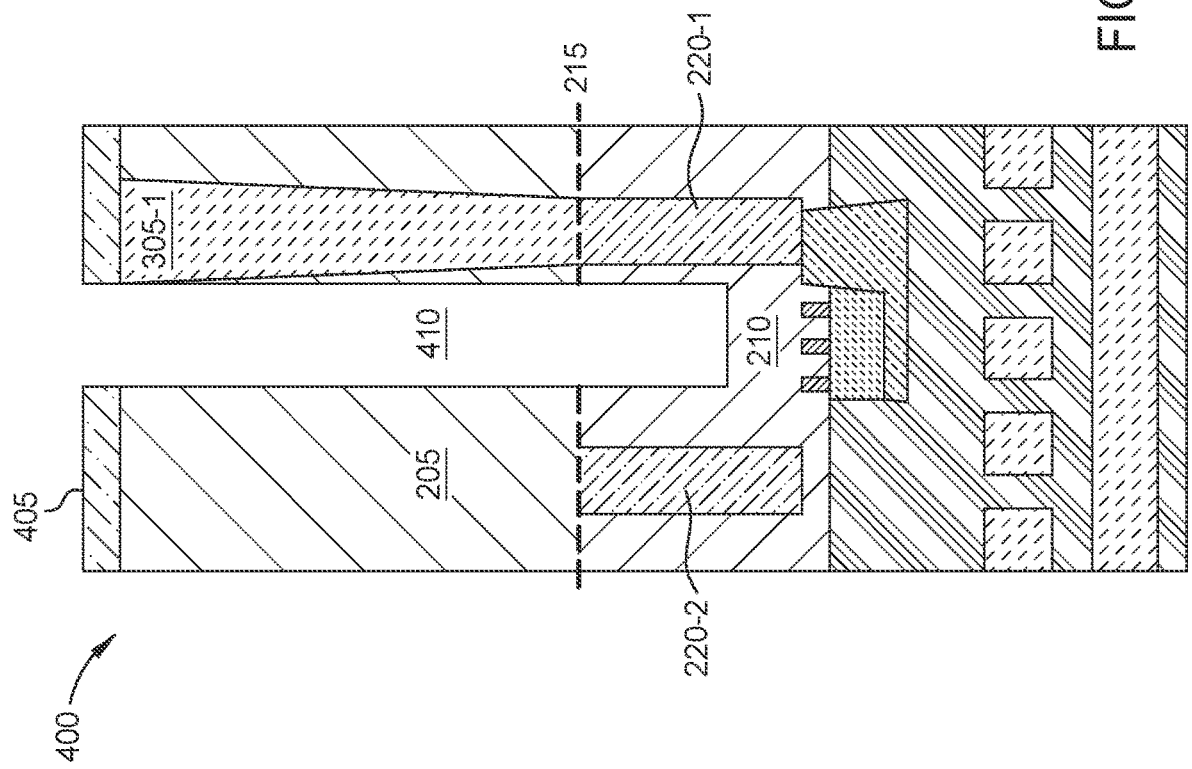
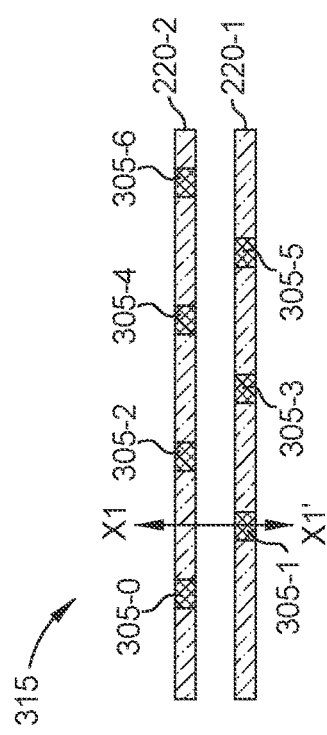

BACKSIDE METAL-INSULATOR-METAL (MIM) CAPACITORS EXTENDING THROUGH BACKSIDE INTERLAYER DIELECTRIC (BILD) LAYER OR SEMICONDUCTOR LAYER AND PARTLY THROUGH DIELECTRIC LAYER

BACKGROUND

The present disclosure generally relates to fabrication methods and structures for semiconductor devices, and more specifically, to techniques for forming backside metal-insulator-metal (MIM) capacitors in a semiconductor device.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased semiconductor device density and increased performance over planar transistors.

A low-impedance power supply including power rails and capacitors may support high-intensity, high-performance semiconductor devices. In some cases, the power rails may be formed within metal layers such as the M1 layer during back-end-of-line (BEOL) processing. In contrast, backside power rails (BPRs) may be formed on the backside of the wafer, when inverted, after one or more BEOL layers are formed.

Deep trench capacitors (DTCs), often used in embedded dynamic random-access memory (eDRAM), tend to have a high aspect ratio (greater than 10:1) and may be used in proximity of circuitry of the semiconductor device. However, DTCs tend to require a depth of greater than 10 microns and a gate pitch of greater than 1 micron, which may not be suitable for higher-density semiconductor devices (e.g., having a gate pitch of less than 100 nm).

SUMMARY

According to one embodiment, a method comprises forming backside power rails in a dielectric layer arranged above a backside interlayer dielectric (BILD) layer or a semiconductor layer, forming a trench that extends through the BILD layer or the semiconductor layer and partly through the dielectric layer between the backside power rails, depositing a plurality of layers to form a backside metal-insulator-metal (MIM) capacitor in the trench, and forming a first contact to a first metal layer of the plurality of layers. Forming the first contact comprises forming first recesses in a second metal layer of the plurality of layers, and filling the first recesses with an insulative material. The method further comprises forming a second contact to the second metal layer. Forming the second contact comprises forming second recesses in the first metal layer, and filling the second recesses with the insulative material.

According to another embodiment, a semiconductor device comprises a backside interlayer dielectric (BILD) layer or a semiconductor layer, a dielectric layer arranged above the BILD layer or the semiconductor layer, backside power rails in the dielectric layer, a backside metal-insulator-metal (MIM) trench capacitor extending through the BILD layer or the semiconductor layer and partly through the dielectric layer between the backside power rails. The backside MIM trench capacitor comprises a first metal layer spaced apart from a second metal layer. The semiconductor device further comprises a first contact that overlaps a first region of the backside MIM trench capacitor. In the first region, the first metal layer contacts the first contact, and the second metal layer is recessed and an insulative material contacts the first contact. The semiconductor device further comprises a second contact that overlaps a second region of the backside MIM trench capacitor. In the second region, the first metal layer is recessed and the insulative material contacts the second contact, and the second metal layer contacts the second contact.

According to another embodiment, a computer program product for fabricating a semiconductor device comprises a computer-readable storage medium having computer-readable program code embodied therewith. The computer-readable program code is executable by one or more computer processors to perform an operation comprising forming backside power rails in a dielectric layer arranged above a backside interlayer dielectric (BILD) layer or a semiconductor layer, forming a trench that extends through the BILD layer or the semiconductor layer and partly through the dielectric layer between the backside power rails, depositing a plurality of layers to form a backside metal-insulator-metal (MIM) capacitor in the trench, and forming a first contact to a first metal layer of the plurality of layers. Forming the first contact comprises forming first recesses in a second metal layer of the plurality of layers, and filling the first recesses with an insulative material. The operation further comprises forming a second contact to the second metal layer. Forming the second contact comprises forming second recesses in the first metal layer, and filling the second recesses with the insulative material.

BRIEF DESCRIPTION OF THE SEVERAL VIEWS OF THE DRAWINGS

FIG. 2 illustrates a semiconductor device after one or more front-end-of-line (FEOL) processes and one or more back-end-of-line (BEOL) processes, and bonding a carrier wafer to a top surface defined by the one or more BEOL processes, according to one or more embodiments.

FIG. 3A is a cross-section view, and FIG. 3B is a top diagrammatic view, of forming backside conductive vias that contact backside power rails, according to one or more embodiments.

FIG. 4 illustrates forming a trench that extends between the backside power rails, according to one or more embodiments.

DETAILED DESCRIPTION

According to embodiments described herein, a method comprises forming backside power rails in a dielectric layer arranged above a backside interlayer (BILD) layer or a semiconductor layer, forming a trench that extends through the BILD layer or the semiconductor layer and partly through the dielectric layer between the backside power rails, and depositing a plurality of layers to form a backside metal-insulator-metal (MIM) capacitor in the trench. The method further comprises forming a first contact to a first metal layer of the plurality of layers, where forming the first contact comprises forming first recesses in a second metal layer of the plurality of layers, and filling the first recesses with an insulative material. The method further comprises forming a second contact to the second metal layer, where forming the second contact comprises forming second recesses in the first metal layer, and filling the second recesses with the insulative material.

Beneficially, the method enables lower-impedance implementations of the power supply for the semiconductor device. In some embodiments, the MIM capacitor is formed using front-end-of-line (FEOL) materials and processes, and may have a relatively greater density (e.g., 150 fF per um$^2$ or greater) with a smaller pitch (e.g., less than 100 nm) than MIM capacitors that are formed using back-end-of-line (BEOL) materials and processes.

Various embodiments of the disclosure describe power supply implementations that are suitable for higher-density semiconductor devices, such as nanosheet stack FETs and/or FinFETs. However, the techniques discussed herein may be applied to other types of semiconductor devices such as planar devices.

Figure 1:
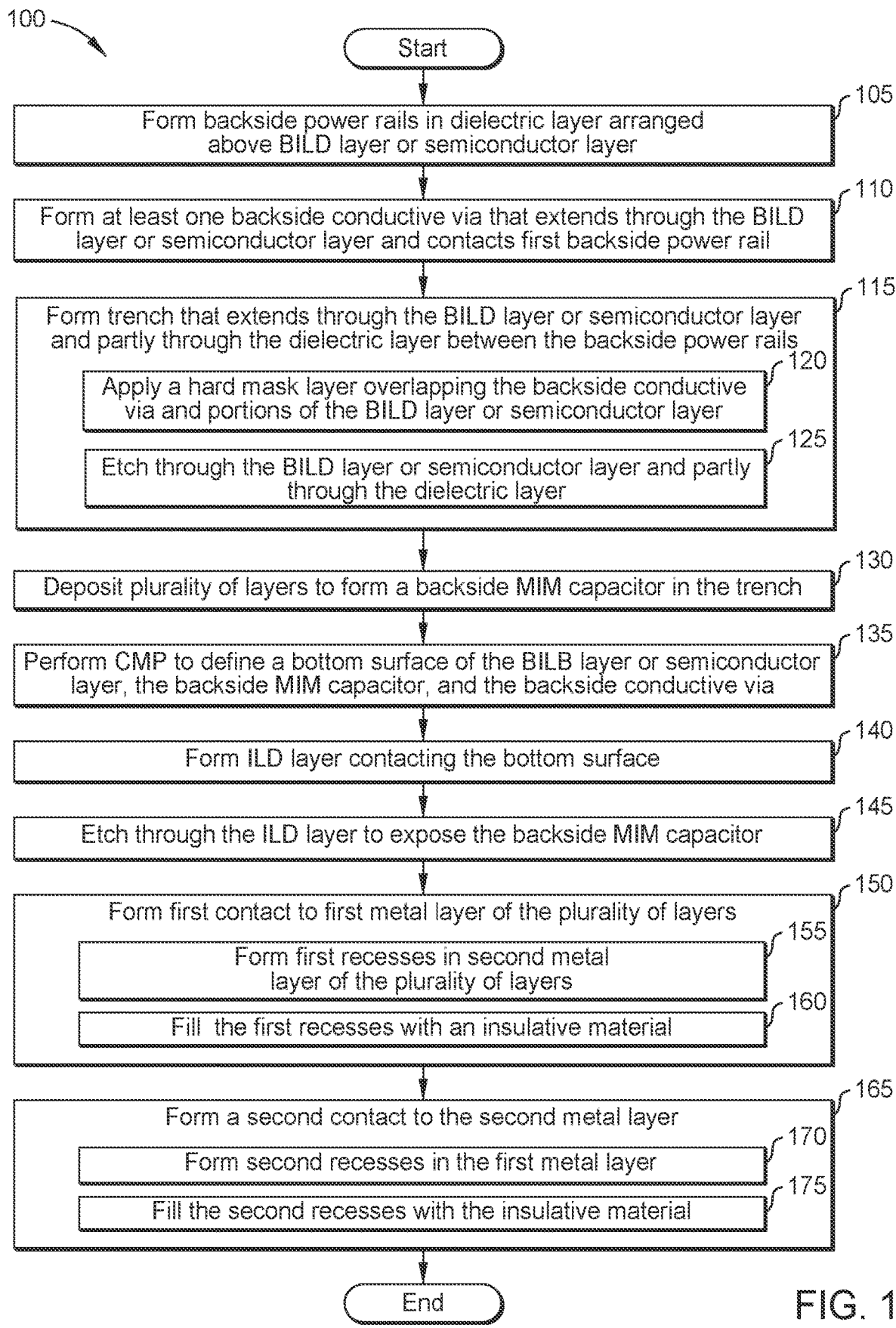
FIG. 1 is a method for fabricating a semiconductor device, according to one or more embodiments.
Figure 5:
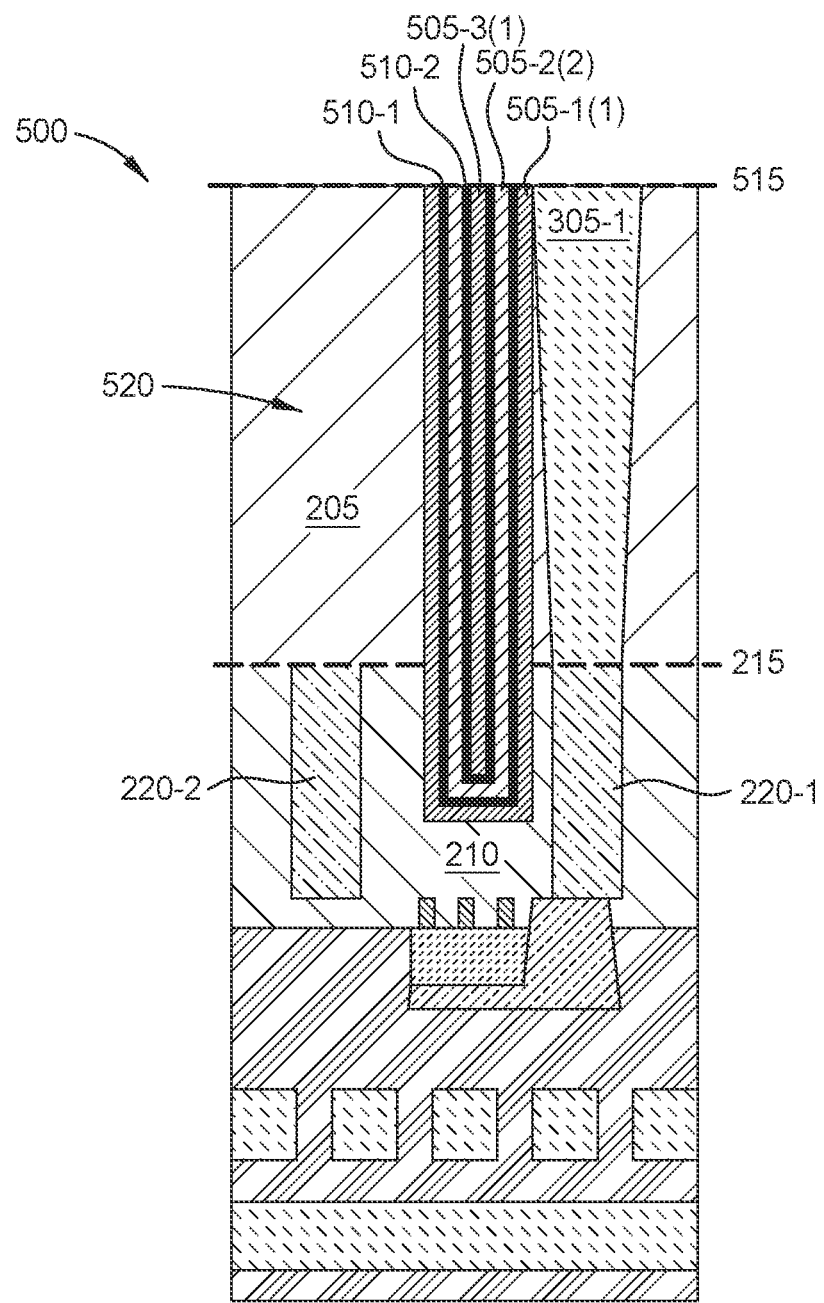
FIG. 5 illustrates forming a backside metal-insulator-metal (MIM) capacitor in a trench, according to one or more embodiments.

FIG. 1 is a method 100 for fabricating a semiconductor device, according to one or more embodiments. The method 100 may be implemented using any suitable fabrication devices, processes, and/or materials that will be known to the person of ordinary skill in the art. Further, in some embodiments, a computer program product includes computer-readable program code that is executable by one or more computer processors (e.g., implemented in one or more controllers for one or more fabrication devices) to perform the method 100.

The method 100 begins at block 105, where backside power rails are formed in a dielectric layer arranged above a backside interlayer dielectric (BILD) layer or a semiconductor layer. Refer also to FIG. 2, which illustrates a semiconductor device 200 after one or more front-end-of-line (FEOL) processes and one or more back end of line (BEOL) processes, and bonding a carrier wafer to a top surface defined by the one or more BEOL processes. Generally, the FEOL process(es) correspond to fabrication of active components of the semiconductor device 200, e.g., transistors of any suitable configuration (e.g., planar FETs, nanosheet stack FETs, FinFETs, and so forth). The BEOL process(es) correspond to fabrication of conductive interconnects that are arranged above the active components of the semiconductor device 200. The conductive interconnects are generally driven to communicate clock signals and other electrical signals between the active components of the semiconductor device 200. In some embodiments, the conductive interconnects are formed in multiple metal layers of the semiconductor device 200, where each metal layer comprises metal lines that are spaced apart by dielectric material(s). Conductive vias may extend vertically through the dielectric materials to interconnect different metal layers and/or the active components.

In some conventional implementations, the conductive interconnects may be included in a power distribution network that is arranged above the active components and that provides power to the active components. However, in various embodiments discussed herein, backside power rails (BPRs) are formed in the semiconductor device separately from the conductive interconnects (e.g., in a backside of the wafer after one or more BEOL layers are formed) and used to provide power to the active components. In some embodiments, a backside metal-insulator-metal (MIM) trench capacitor is formed adjacent to, and connected with, one or more of the BPRs to provide a low-impedance power supply for the active components.

In the semiconductor device 200, a dielectric layer 210 is arranged above a BILD layer 205 (alternately, a semiconductor layer), and BPRs 220-1, 220-2 are formed in the dielectric layer 210.

The BILD layer 205 or semiconductor layer, the dielectric layer 210, and the BPRs 220-1, 220-2 may be formed of any suitable materials. In some embodiments, the BILD layer 205 comprises a silicon dioxide ($SiO_2$) or low-k dielectric (k value<3.9) layer, the dielectric layer 210 comprises an oxide layer such as silicon dioxide ($SiO_2$), and the BPRs 220-1, 220-2 comprises a conductive material such as copper (Cu), cobalt (Co), or ruthenium (Ru). In some alternate embodiments, the semiconductor layer is a silicon (Si) layer.

As discussed above, a number of active components may be formed in the semiconductor device 200. As shown, the semiconductor device 200 comprises a transistor with a plurality of (active) fins 235 over the dielectric layer 210, a source/drain epitaxy 230 formed over the fins 235, in a dielectric material (e.g., an interlayer dielectric (ILD) layer) 225 over the source/drain epitaxy 230. A contact 240 extends from the BPR 220-1 partly through the dielectric layer 210 and partly through the dielectric material 225 and contacts a side surface and/or a top surface of the source/drain epitaxy 230. Although the dielectric layer 210 and the BPRs 220-1, 220-2 are illustrated in FIG. 2, in some embodiments the dielectric layer 210 and the BPRs 220-1, 220-2 are formed in a later stage of fabrication after carrier wafer bonding, which is discussed in greater detail below.

The semiconductor device 200 further comprises a plurality of metal layers 245, 250 that are arranged above the active components and formed in the dielectric material 225. As shown, the metal layer 245 is the M1 layer having unidirectional metal lines extending in a first direction (e.g., into and out of the page), and the metal layer 250 is the M2 layer having unidirectional metal lines extending in a second direction orthogonal to the first direction (e.g., to the left and right). Although not shown, one or more vias may be formed between the different metal layers 245, 250 and/or between the metal layer 245 and the contact 240. Further, although two layers of BEOL interconnects are illustrated, the semiconductor device 200 may include more than two layers of BEOL interconnects, e.g., above the M1 layer and the M2 layer.

After all BEOL interconnects are built, a carrier wafer 255 (shown in outline) is bonded to a top surface of the BEOL interconnects using dielectric (260) bonding, such as oxide-oxide bonding to accommodate further handling and processing of the semiconductor device 200. Any suitable materials and bonding techniques for the carrier wafer 255 are contemplated and will be understood by the person of ordinary skill in the art. After carrier bonding, the wafer can be flipped, and substrate can be removed until bottom surface of the fins 235 are exposed, and the dielectric layer 210 can be deposited and said BPRs 220-1, 220-2 can be formed to connect to a bottom surface of the contact 240. After that, additional BILD 205 can be deposited over the dielectric layer 210.

The method 100 proceeds to block 110, where at least one backside conductive via 305-1 is formed that extends through the BILD layer 205 (or alternately, the semiconductor layer) and contacts a first BPR 220-1. In some embodiments, forming the backside conductive via 305 comprises a litho, an etch, and a metallization process.

FIG. 3A provides a cross-section view 300 at section X1-X1' corresponding to a position X1 along a first dimension (e.g., a longitudinal axis) of the semiconductor device 200. FIG. 3B provides a top diagrammatic view 315, of forming backside conductive vias 305-0, 305-1, . . . , 305-6 that contact the BPRs 220-1, 220-2. As shown, the backside conductive vias 305-1, 305-3, 305-5 contact the BPR 220-1, and the backside conductive vias 305-0, 305-2, 305-4, 305-6 contact the BPR 220-2. The backside conductive vias 305-1, 305-3, 305-5 are in a staggered arrangement with the backside conductive vias 305-0, 305-2, 305-4, 305-6 along the first dimension.

The backside conductive vias 305-0, 305-1, . . . , 305-6 extend from a top surface 310 of the BILD layer 205 to the surface 215 of the dielectric layer 210 to contact the respective BPR 220-1, 220-2. The backside conductive vias 305-0, 305-1, . . . , 305-6 may be formed of any suitable materials (e.g., Cu, Co, Ru, which may further include a thin adhesion metal liner, such as TiN, TaN) using any suitable techniques.

The method 100 proceeds to block 115, where a trench 410 is formed that extends through the BILD layer 205 (or alternatively, the semiconductor layer) and partly through the dielectric layer 210 between the BPRs 220-1, 220-2. In diagram 400 of FIG. 4, the trench 410 extends into the dielectric layer 210 between the BPRs 220-1, 220-2, and is proximate to the backside conductive via 305-1. In an alternate configuration, the trench 410 may be further from the backside conductive via 305-1, such as being centered between the BPRs 220-1, 220-2. In another alternate configuration, the trench 410 may be formed proximate to, and laterally outward of, one of the BPRs 220-1, 220-2.

In some embodiments, forming the trench 410 comprises (at block 120) applying a hard mask layer 405 that overlaps the backside conductive via 305-1 and portions of the BILD layer 205 (or alternatively, the semiconductor layer) through a litho and patterning process, and (at block 125) etching, at an opening of the hard mask layer 405, through the BILD layer 205 (or alternatively, the semiconductor layer) and partly through the dielectric layer 210. The etching may include any process(es) suitable for directional etching, such as reactive ion etching.

The method 100 proceeds to block 130, where a plurality of layers are deposited to form a backside MIM capacitor 520 in the trench 410. As shown, the plurality of layers comprises five (5) layers: a first metal layer 505-1 of a first metal (1), a first insulation layer 510-1, a second metal layer 505-2 of a second metal (2), a second insulation layer 510-2, and a third metal layer 505-3 of the first metal (1).

In some embodiments, the first metal comprises a different material than the second metal. For example, the first metal may be a titanium nitride (TiN) metal, and the second metal may be a titanium carbide (TiC) metal. The first insulation layer and the second insulator layer each comprises a high-k dielectric material, such as hafnium oxide ($HfO_2$), zirconium oxide ($ZrO_2$), a combination of $HfO_2$ and $ZrO_2$, or any other suitable combination include $HfO_2$. Other combinations of materials are also contemplated for the backside MIM capacitor 520, as well as other configurations of the plurality of layers. In one example, the backside MIM capacitor 520 may include as few as three (3) layers: the first metal layer 505-1, the first insulation layer 510-1, and the second metal layer 505-2. In another example, the backside MIM capacitor 520 comprises more than five (5) layers, where additional layers of the first metal (1) and the second metal (2) are provided in an alternating arrangement and spaced apart from each other by insulation layers. Further, the first insulation layer 510-1, the second insulation layer 510-2, and any other insulation layers need not be formed of a same material as each other.

Figure 6:
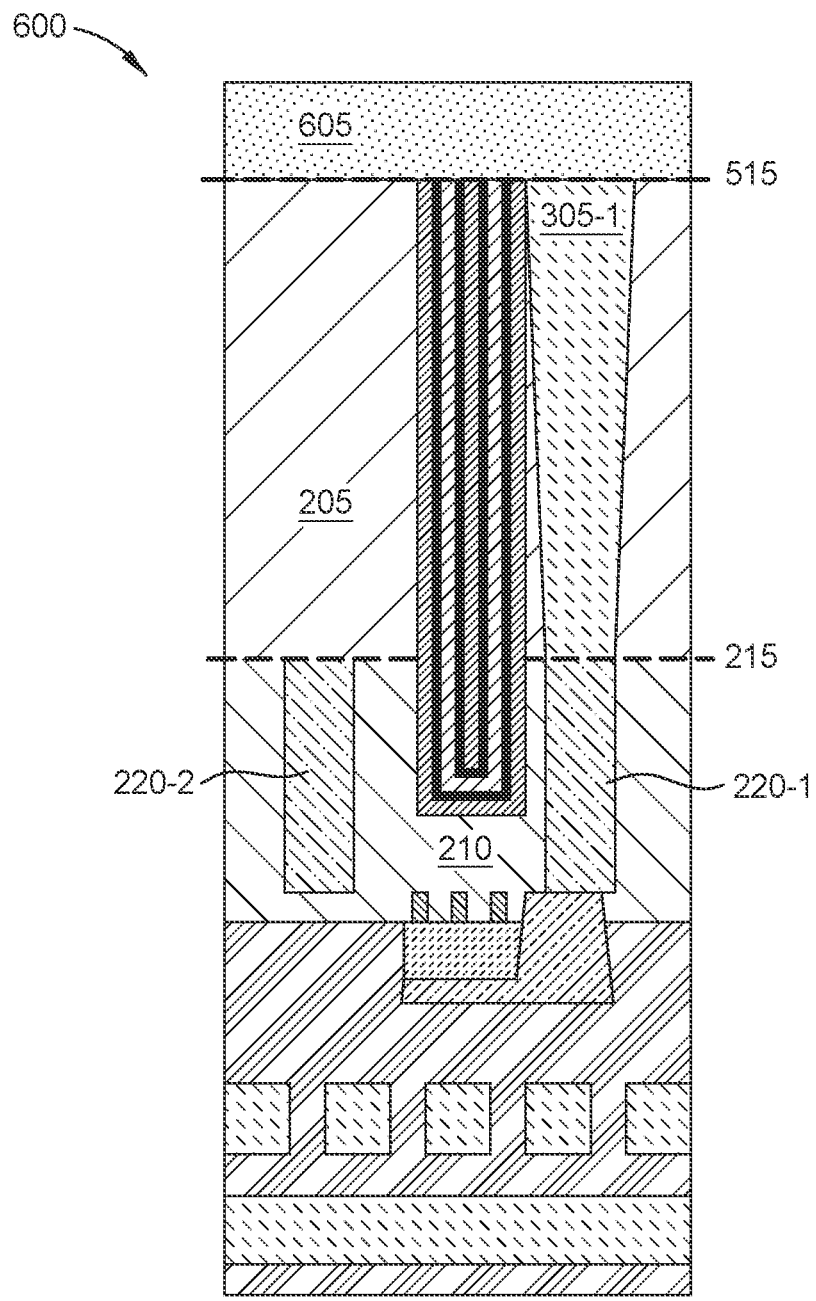
FIG. 6 illustrates forming an interlayer dielectric (ILD) layer contacting a bottom surface of a backside MIM capacitor, according to one or more embodiments.

In some embodiments, chemical-mechanical polishing (CMP) is performed at block 135 to define a bottom surface 515 of the semiconductor layer 205, the backside MIM capacitor 520, and the backside conductive via 305-1. Referring to diagram 600 of FIG. 6, the method 100 continues at block 140, where an interlayer dielectric layer 605 is formed that contacts the bottom surface 515 (e.g., deposited on the bottom surface 515) of the MIM capacitor 520.

Figure 7:
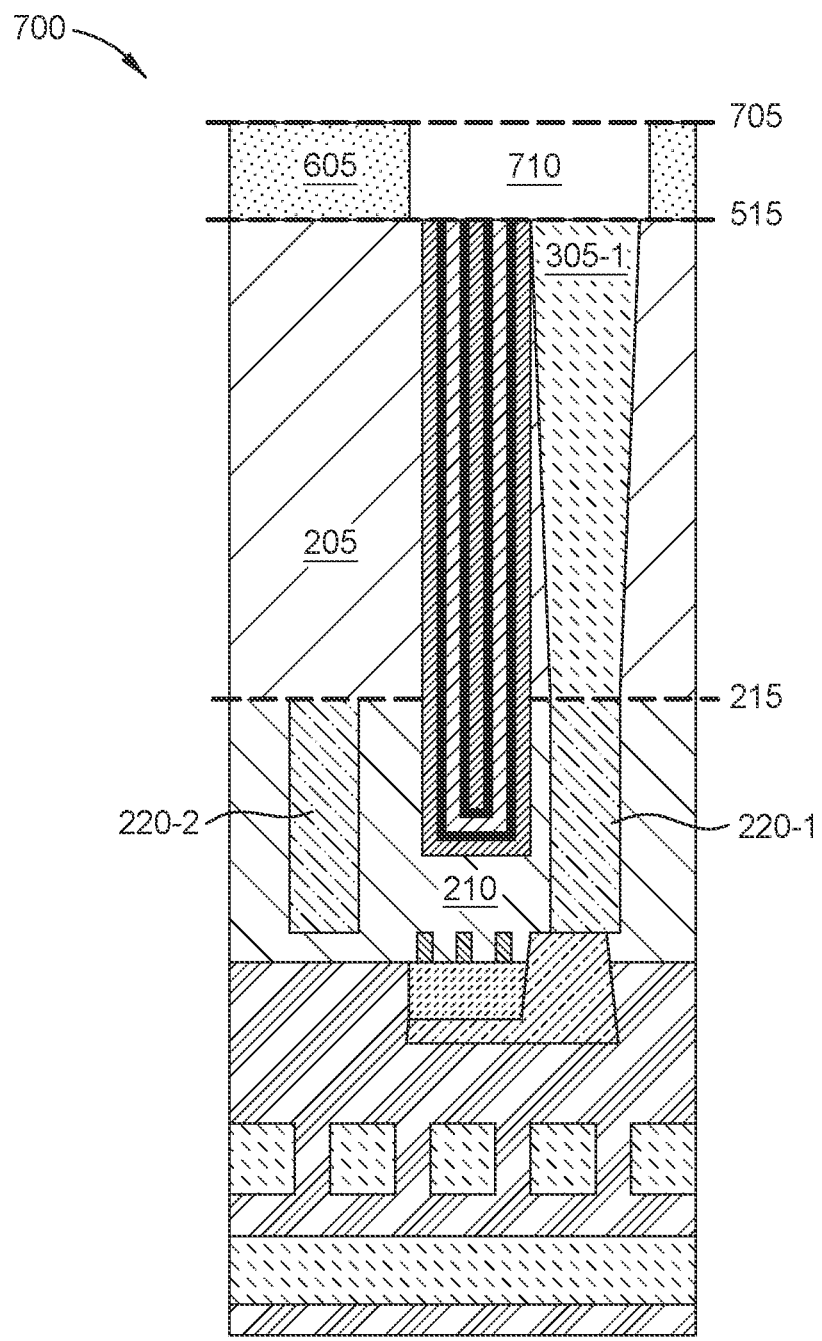
FIG. 7 illustrates exposing the backside MIM capacitor, according to one or more embodiments.

Referring to diagram 700 of FIG. 7, the method 100 continues at block 145, where the ILD layer 605 is etched through to expose the backside MIM capacitor 520. As shown, the ILD layer 605 is etched from a bottom surface 705 to the bottom surface 515 to form an opening 710 in the ILD layer 605. As shown, the backside MIM capacitor 520 and the backside conductive via 305-1 are both exposed through the opening 710.

Figure 8:
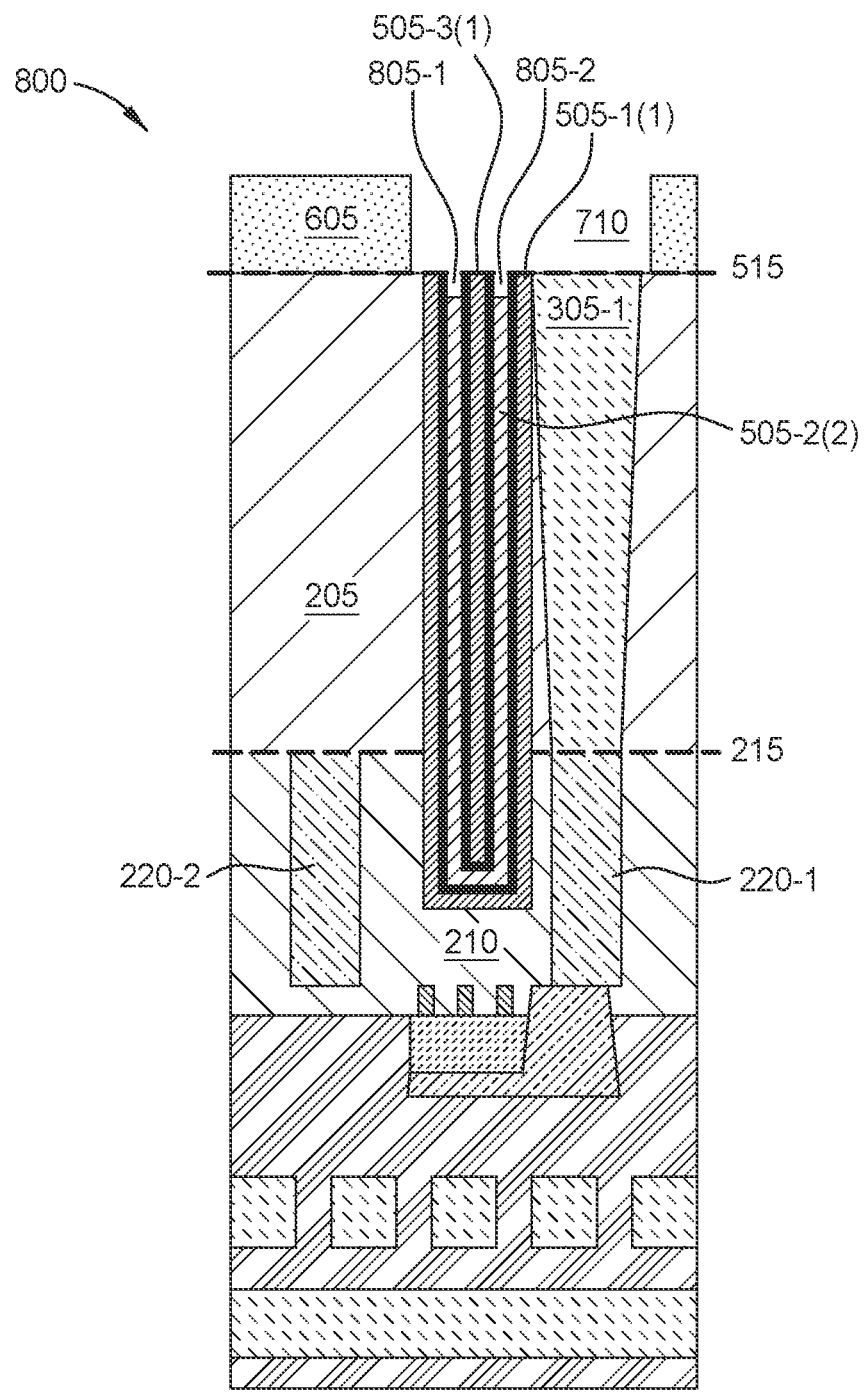
FIG. 8 illustrates forming recesses in a first metal layer of the backside MIM capacitor, according to one or more embodiments.
Figure 9:
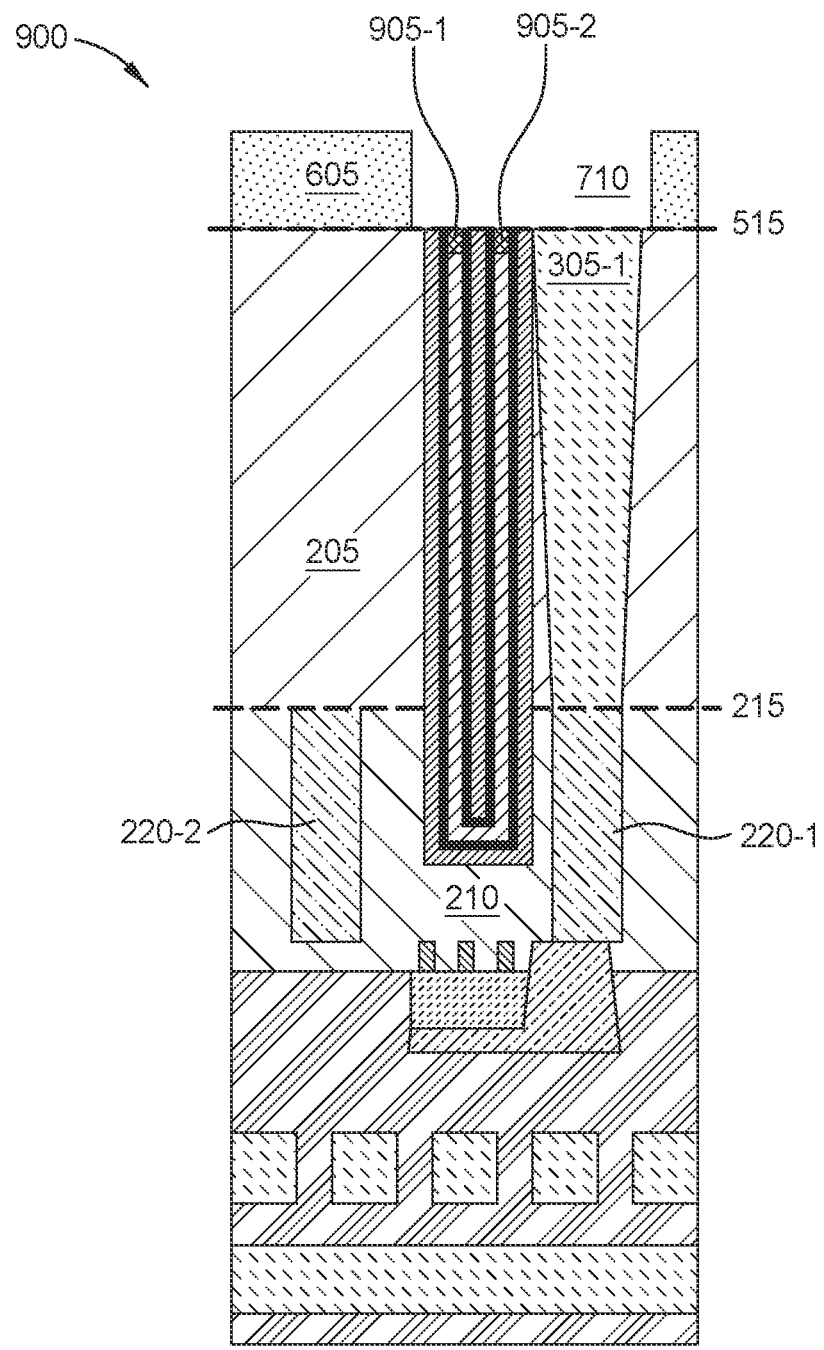
FIG. 9 illustrates filling the recesses in the first metal layer with an insulative material, according to one or more embodiments.

The method 100 continues at block 150, where a first contact is formed to a first metal layer of the plurality of layers. The first contact is formed at the position X1 along the first dimension of the semiconductor device 200. In some embodiments, and referring to diagram 800 of FIG. 8, forming the first contact comprises (at block 155) forming first recesses 805-1, 805-2 in the second metal layer 505-2 of the plurality of layers. For example, forming the first recesses 805-1, 805-2 may include selectively etching the second metal (2) of the second metal layer 505-2 to a predetermined depth from the bottom surface 515, while the first metal (1) of the first metal layer 505-1 and the third metal layer 505-3 extends to the bottom surface 515. One example of selectively recessing TiC with respect to TiN is to use APM wet etch ($NH_4OH:H_2O_2:H_2O$ at a particular ratio and temperature). Referring to diagram 900 of FIG. 9, forming the first contact further comprises (at block 160) filling the first recesses 805-1, 805-2 with an insulative material 905-1, 905-2, which isolates the second metal layer 505-2 from the first contact when later formed in the opening 710. In some embodiments, the insulative material 905-1, 905-2 is formed by a conformal dielectric liner deposition to completely fill the recesses 805-1 and 805-2, followed by an isotropic etch process to remove the dielectric liner everywhere except the regions dielectric liner is pinched-off in the first recesses 805-1, 805-2. In some embodiments, the insulative material 905-1, 905-2 extends to the bottom surface 515.

The method 100 continues at block 165, where a second contact is formed to the second metal layer of the plurality of layers. The second contact is formed at a position X2 along the first dimension of the semiconductor device 200. The relative locations of the positions X1, X2 for the contacts to the MIM capacitor 520 are shown in diagram 1025 of FIG. 10C. Notably, the opening 710 for the first contact overlaps the backside conductive via 305-1, and an opening 1020 for the second contact does not overlap any of the backside conductive vias 305-0, 305-1, . . . , 305-6. In one alternate embodiment, neither the opening 710 nor the opening 1020 overlaps any of the backside conductive vias 305-0, 305-1, . . . , 305-6, such that neither the first contact nor the second contact couple the MIM capacitor 520 with either of the BPRs 220-1, 220-2. Stated another way, the various metal layers of the MIM capacitor 520 may be externally coupled through the bottom of the semiconductor device 200. In another alternate embodiment, more than two openings 710, 1020 may be formed to form more than two contacts to the MIM capacitor 520.

Figure 10A:
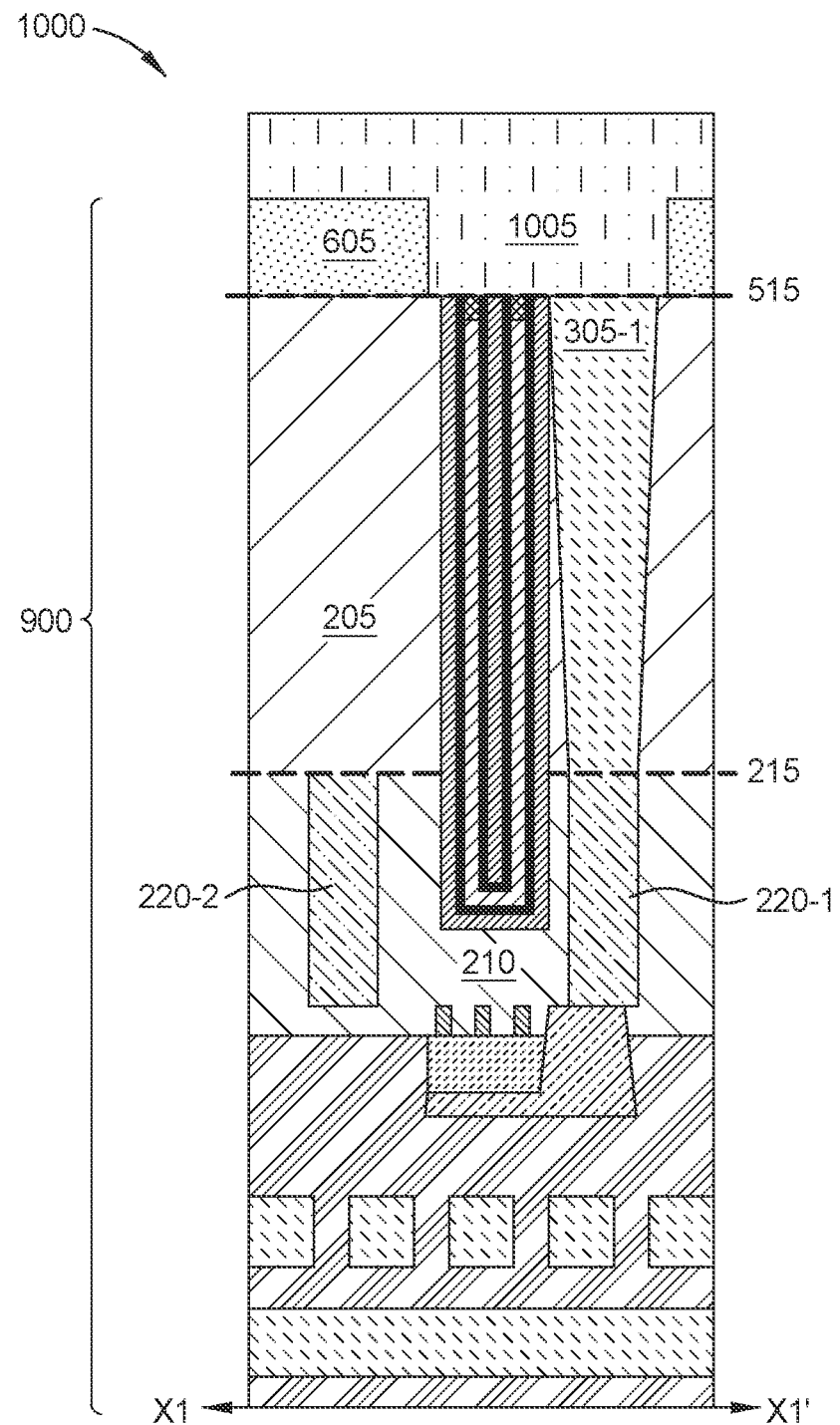
FIGS. 10A and 10B are cross-section views.
Figure 10B:
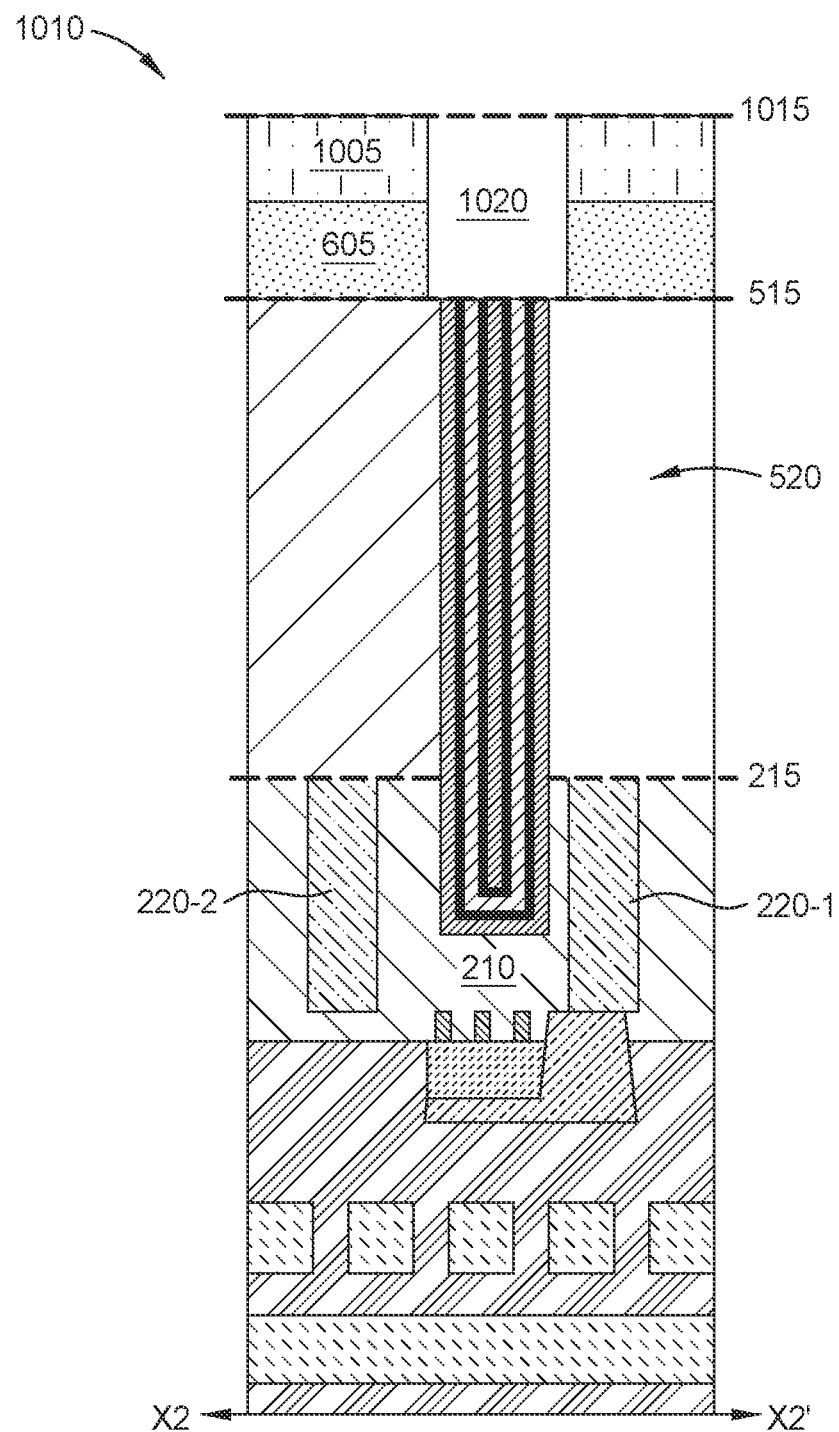
Figure 10C:
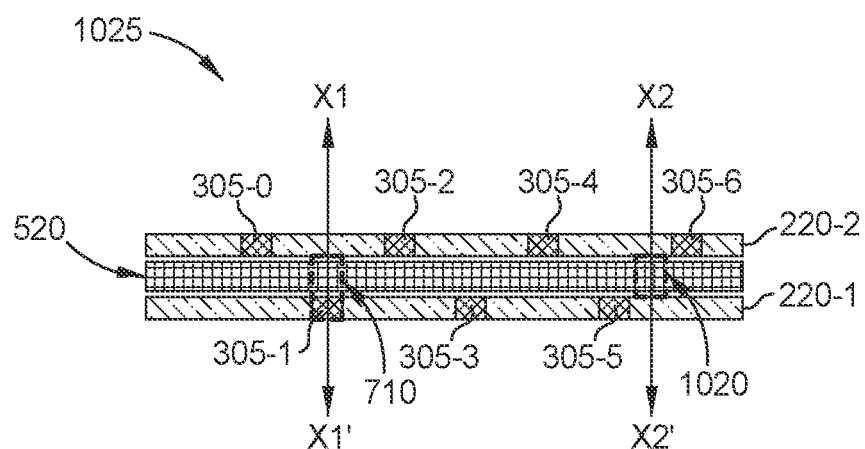
FIG. 10C is a top diagrammatic view, illustrating contact regions of the backside MIM capacitor, according to one or more embodiments.

In some embodiments, and referring to diagram 1000 of FIG. 10A and diagram 1010 of FIG. 10B, forming the second contact comprises forming an organic planarization layer (OPL) 1005 over the ILD layer 605, such that OPL 1005 fills the opening 710 at the position X1. Forming the second contact further comprises litho masking and etching process to define the contact opening in the OPL 1005, through the ILD layer 605, to the bottom surface 515 of the MIM capacitor 520. The opening 1020 defined by the etching exposes the MIM capacitor 520 at the position X2. As shown in the diagram 1025, in some embodiments, a longitudinal axis of the MIM capacitor 520 is substantially parallel to the BPRs 220-1, 220-2.

Figure 11:
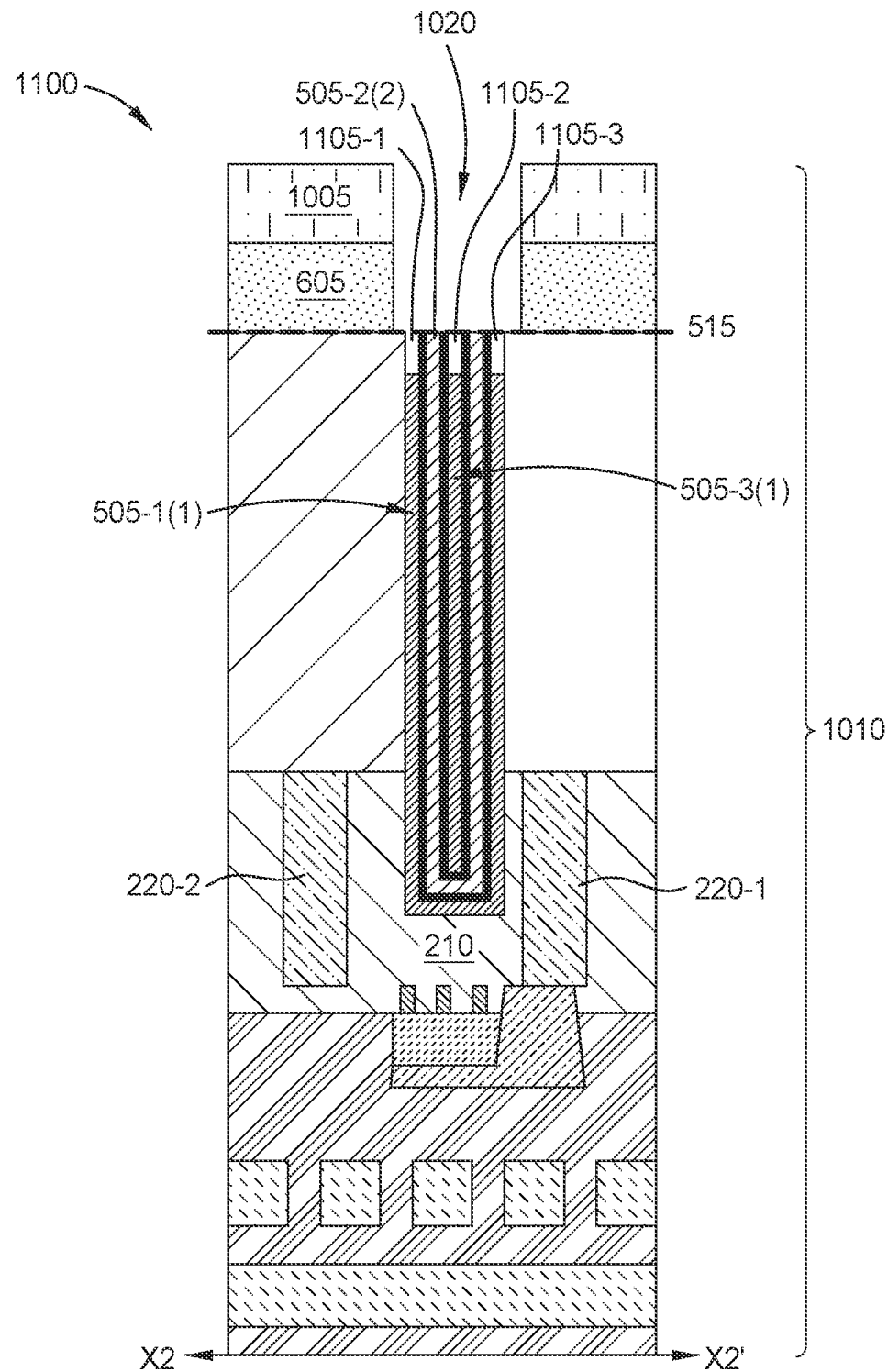
FIG. 11 illustrates forming recesses in a second metal layer of the backside MIM capacitor, according to one or more embodiments.
Figure 12:
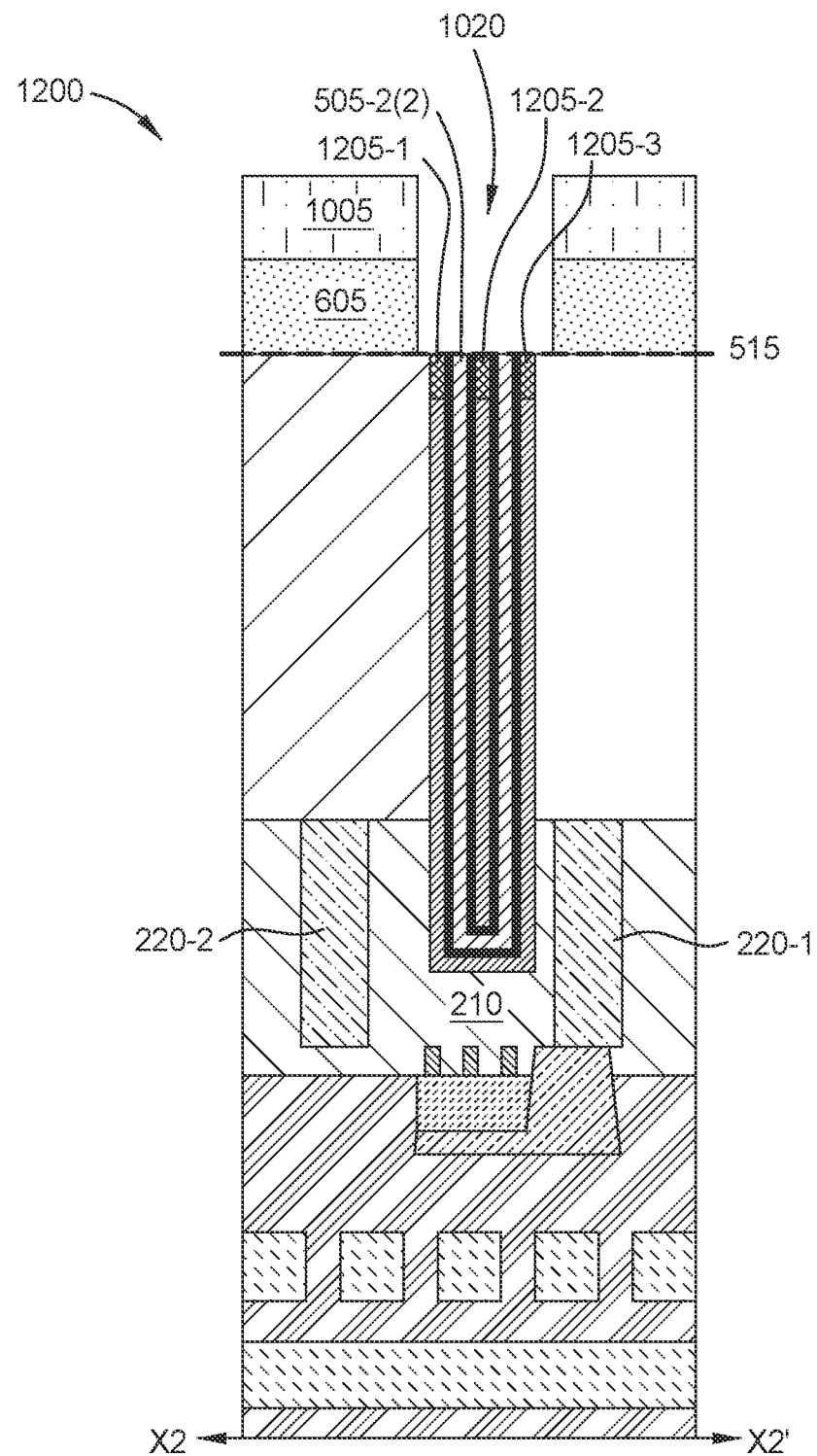
FIG. 12 illustrates filling the recesses in the second metal layer with an insulative material, according to one or more embodiments.

In some embodiments, and referring to diagram 1100 of FIG. 11, forming the second contact comprises (at block 170) forming second recesses 1105-1, 1105-2, 1105-3 in the first metal layer 505-1 and the third metal layer 505-3. For example, forming the second recesses 1105-1, 1105-2, 1105-3 may include selectively etching the first metal (1) of the first metal layer 505-1 and the third metal layer 505-3 to a predetermined depth from the bottom surface 515, while the second metal (2) of the second metal layer 505-2 extends to the bottom surface 515. One example of selectively recessing TiN with respect to TiC is using $H_2O_2:H_2O$ at a particular ratio and temperature. Referring to diagram 1200 of FIG. 12, forming the second contact further comprises (at block 175) filling the second recesses 1105-1, 1105-2, 1105-3 with an insulative material 1205-1, 1205-2, 1205-3, which isolates the first metal layer 505-1 and the third metal layer 505-3 from the second contact when later formed in the opening 1020. In some embodiments, the insulative material 1205-1, 1205-2, 1205-3 is formed by a conformal dielectric liner deposition to completely fill the second recesses 1105-1, 1105-2, 1105-3, followed by an isotropic etch process to remove the dielectric liner everywhere except the regions dielectric liner is pinched-off in the second recesses 1205-1, 1205-2, 1205-3. In some embodiments, the insulative material 1205-1, 1205-2, 1205-3 extends to the bottom surface 515.

Figure 13A:
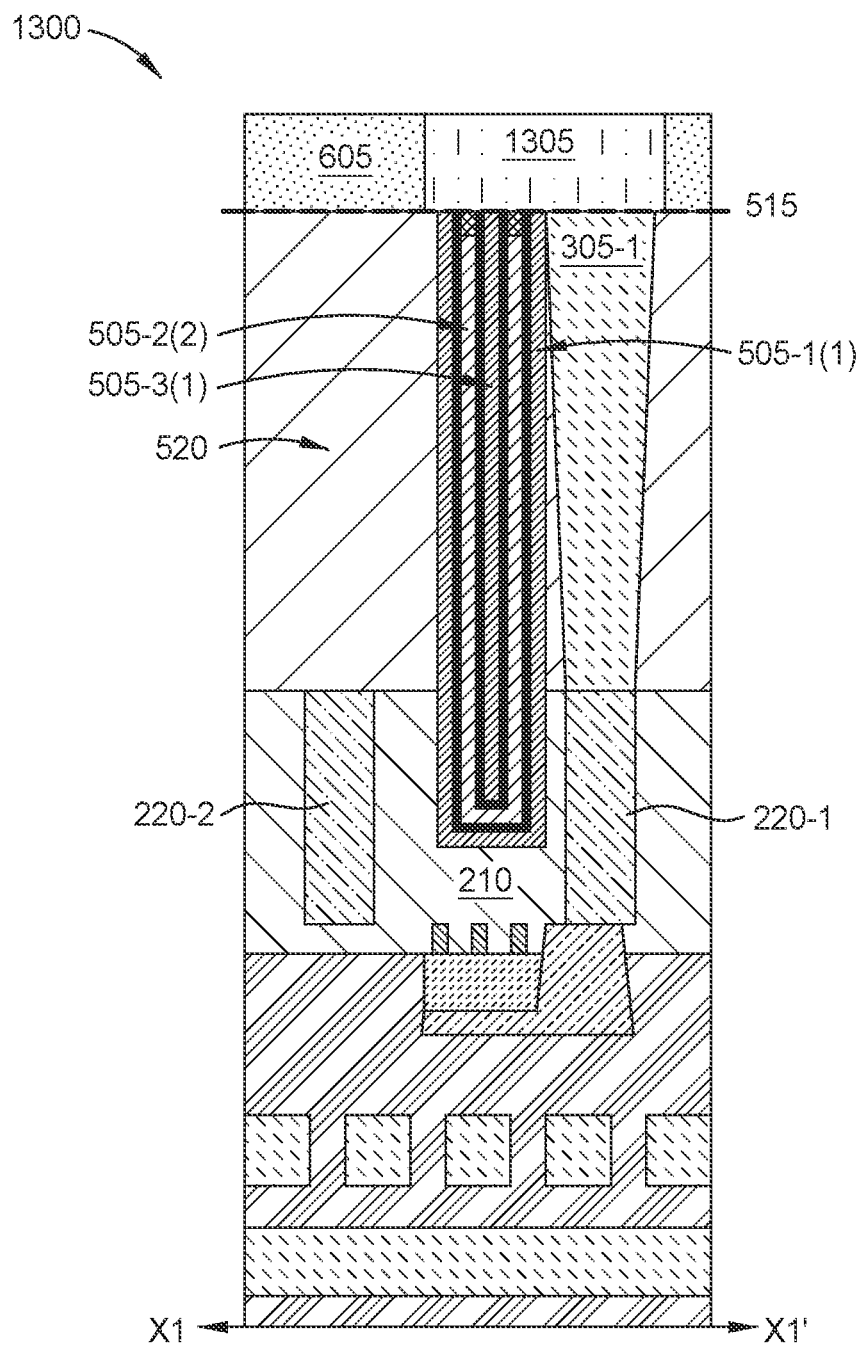
FIG. 13A illustrates forming a first contact to the second metal layer of the backside MIM capacitor, according to one or more embodiments.

The OPL 1005 may be selectively etched to expose the ILD layer 605 and the MIM capacitor 520 at the openings 710, 1020, using, e.g., an ash process. As shown in diagram 1300 of FIG. 13A, forming the first contact 1305 (block 150) further comprises depositing a conductive material in the opening 710. The first contact 1305 contacts the first metal layer 505-1 and the third metal layer 505-3 with the backside conductive via 305-1, while the second metal layer 505-2 is insulated from the first contact 1305. Forming the first contact 1305 may further comprise performing CMP of the deposited conductive material in the opening 710.

Figure 13B:
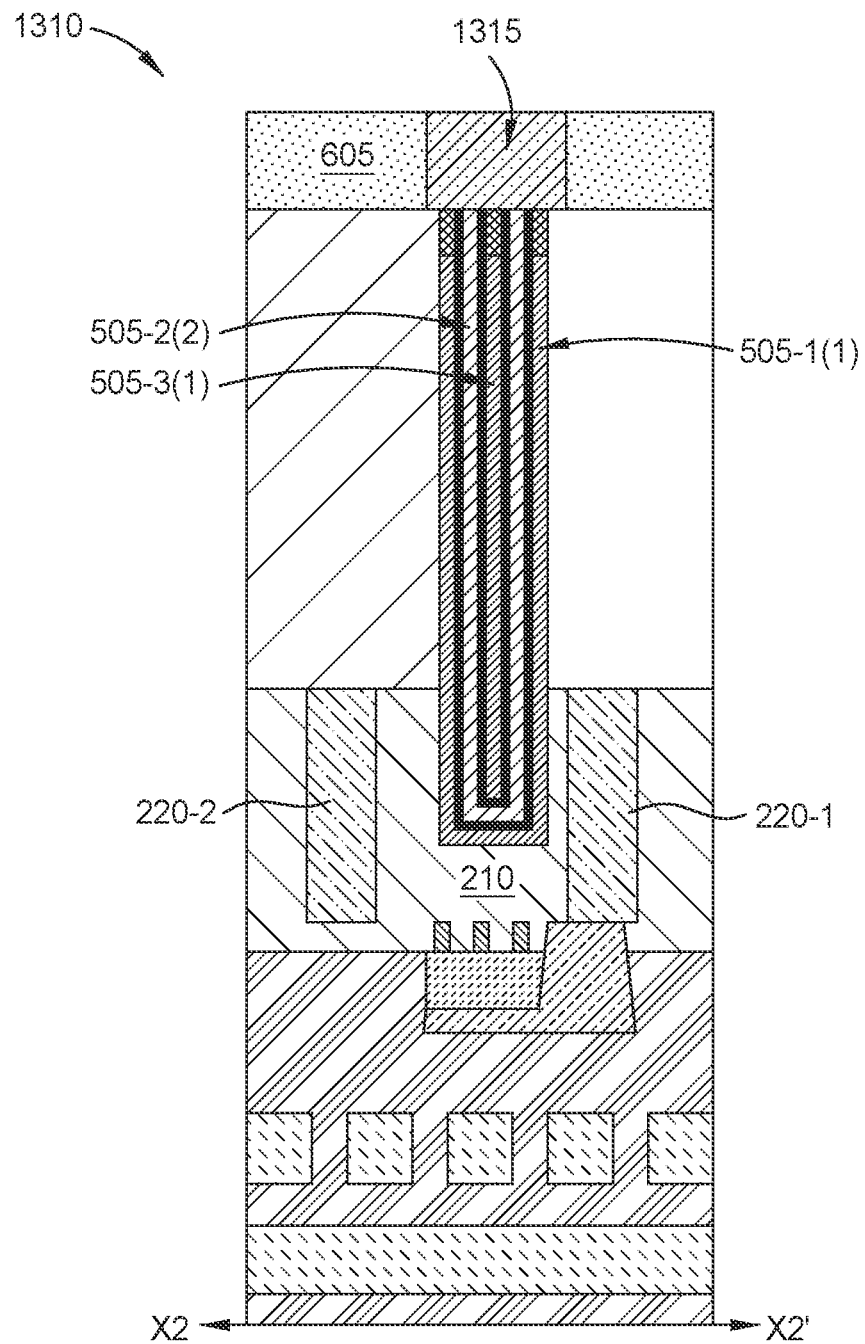
FIG. 13B illustrates forming a second contact to the first metal layer of the backside MIM capacitor, according to one or more embodiments.

As shown in diagram 1310 of FIG. 13B, forming the second contact 1315 (block 165) further comprises depositing a conductive material in the opening 1020. The second contact 1315 contacts the second metal layer 505-2 while the first metal layer 505-1 and the third metal layer 505-3 are insulated from the second contact 1315. Forming the second contact 1315 may further comprise performing CMP of the deposited conductive material in the opening 1020. Although depicted separately in diagrams 1300, 1310, in some embodiments, blocks 150, 165 may be performed simultaneously (e.g., as a single metal deposition process and/or a single CMP process). The method 100 ends following completion of block 165.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:
1. A method comprising:
    forming backside power rails in a dielectric layer arranged above a backside interlayer dielectric (BILD) layer or a semiconductor layer;
    forming a trench that extends through the BILD layer or the semiconductor layer and partly through the dielectric layer between the backside power rails;
    depositing a plurality of layers to form a backside metal-insulator-metal (MIM) capacitor in the trench;

forming a first contact to a first metal layer of the plurality of layers, wherein forming the first contact comprises:
  forming first recesses in a second metal layer of the plurality of layers; and
  filling the first recesses with an insulative material; and
forming a second contact to the second metal layer, wherein forming the second contact comprises:
  forming second recesses in the first metal layer; and
  filling the second recesses with the insulative material.

2. The method of claim 1, further comprising:
forming at least one backside conductive via that extends through the BILD layer or the semiconductor layer and contacts a first backside power rail of the backside power rails,
wherein the trench is proximate to the backside conductive via, and
wherein one of the first contact or the second contact couples with the backside conductive via.

3. The method of claim 2, wherein forming the trench comprises:
applying a hard mask layer overlapping the backside conductive via and portions of the BILD layer or the semiconductor layer; and
etching through the BILD layer or the semiconductor layer and partly through the dielectric layer.

4. The method of claim 2, further comprising:
performing chemical-mechanical polishing after depositing the plurality of layers to define a bottom surface of the BILD layer or the semiconductor layer, the backside MIM capacitor, and the backside conductive via;
forming an interlayer dielectric (ILD) layer contacting the bottom surface; and
etching through the ILD layer to expose the backside MIM capacitor.

5. The method of claim 1,
wherein the first metal layer comprises a titanium nitride (TiN) metal,
wherein the second metal layer comprises a titanium carbide (TiC) metal, and
wherein a first insulation layer of the plurality of layers, arranged between the first metal layer and the second metal layer, comprises one or both of hafnium oxide and zirconium oxide.

6. The method of claim 1, wherein the plurality of layers further comprises:
at least a second insulation layer; and
at least a third metal layer having a same metal as one of the first metal layer or the second metal layer.

7. The method of claim 1, wherein a longitudinal axis of the backside MIM capacitor is substantially parallel to the backside power rails.

8. A semiconductor device comprising:
a backside interlayer dielectric (BILD) layer or a semiconductor layer;
a dielectric layer arranged above the BILD layer or the semiconductor layer;
backside power rails in the dielectric layer;
a backside metal-insulator-metal (MIM) trench capacitor extending through the BILD layer or the semiconductor layer and partly through the dielectric layer between the backside power rails, wherein the backside MIM trench capacitor comprises a first metal layer spaced apart from a second metal layer;
a first contact that overlaps a first region of the backside MIM trench capacitor, wherein in the first region, the first metal layer contacts the first contact, and the second metal layer is recessed and an insulative material contacts the first contact; and
a second contact that overlaps a second region of the backside MIM trench capacitor, wherein in the second region, the first metal layer is recessed and the insulative material contacts the second contact, and the second metal layer contacts the second contact.

9. The semiconductor device of claim 8, further comprising:
at least one backside conductive via that extends through the BILD layer or the semiconductor layer and contacts a first backside power rail of the backside power rails,
wherein one of the first contact or the second contact couples with the backside conductive via.

10. The semiconductor device of claim 9, further comprising:
an interlayer dielectric (ILD) layer contacting a bottom surface of the BILD layer or the semiconductor layer, the backside MIM trench capacitor, and the backside conductive via,
wherein the backside MIM trench capacitor is exposed through the ILD layer.

11. The semiconductor device of claim 10, wherein the bottom surface is defined by chemical-mechanical polishing.

12. The semiconductor device of claim 8,
wherein the first metal layer comprises a titanium nitride (TiN) metal,
wherein the second metal layer comprises a titanium carbide (TiC) metal, and
wherein the first metal layer and the second metal layer are separated by a first insulation layer comprising one or both of hafnium oxide and zirconium oxide.

13. The semiconductor device of claim 8, wherein the backside MIM trench capacitor further comprises:
at least a second insulation layer; and
at least a third metal layer having a same metal as one of the first metal layer or the second metal layer.

14. The semiconductor device of claim 8, wherein a longitudinal axis of the backside MIM trench capacitor is substantially parallel to the backside power rails.

15. A computer program product for fabricating a semiconductor device, the computer program product comprising:
a computer-readable storage medium having computer-readable program code embodied therewith, the computer-readable program code executable by one or more computer processors to perform an operation comprising:
  forming backside power rails in a dielectric layer arranged above a backside interlayer dielectric (BILD) layer or a semiconductor layer;
  forming a trench that extends through the BILD layer or the semiconductor layer and partly through the dielectric layer between the backside power rails;
  depositing a plurality of layers to form a backside metal-insulator-metal (MIM) capacitor in the trench;
  forming a first contact to a first metal layer of the plurality of layers, wherein forming the first contact comprises:
    forming first recesses in a second metal layer of the plurality of layers; and
    filling the first recesses with an insulative material; and
  forming a second contact to the second metal layer, wherein forming the second contact comprises:
    forming second recesses in the first metal layer; and filling the second recesses with the insulative material.

16. The computer program product of claim 15, the operation further comprising:
  forming at least one backside conductive via that extends through the BILD layer or the semiconductor layer and contacts a first backside power rail of the backside power rails,
  wherein the trench is proximate to the backside conductive via, and
  wherein one of the first contact or the second contact couples with the backside conductive via.

17. The computer program product of claim 16, wherein forming the trench comprises:
  applying a hard mask layer overlapping the backside conductive via and portions of the BILD layer or the semiconductor layer; and
  etching through the BILD layer or the semiconductor layer and partly through the dielectric layer.

18. The computer program product of claim 16, the operation further comprising:
  performing chemical-mechanical polishing after depositing the plurality of layers to define a bottom surface of the BILD layer or the semiconductor layer, the backside MIM capacitor, and the backside conductive via;
  forming an interlayer dielectric (ILD) layer contacting the bottom surface; and
  etching through the ILD layer to expose the backside MIM capacitor.

19. The computer program product of claim 15,
  wherein the first metal layer comprises a titanium nitride (TiN) metal,
  wherein the second metal layer comprises a titanium carbide (TiC) metal, and
  wherein a first insulation layer of the plurality of layers, arranged between the first metal layer and the second metal layer, comprises one or both of hafnium oxide and zirconium oxide.

20. The computer program product of claim 15, wherein the plurality of layers further comprises:
  at least a second insulation layer; and
  at least a third metal layer having a same metal as one of the first metal layer or the second metal layer.

* * * * *